(12) United States Patent
Kawaguchi et al.

(10) Patent No.: US 8,105,674 B2
(45) Date of Patent: Jan. 31, 2012

(54) SPUTTERING TARGET FOR MAKING OPTICAL MEDIUM, METHOD OF MAKING SAME, OPTICAL MEDIUM, AND METHOD OF MAKING SAME

(75) Inventors: Yukio Kawaguchi, Tokyo (JP); Hiroshi Takasaki, Tokyo (JP); Isamu Kuribayashi, Tokyo (JP)

(73) Assignee: TDK Corporation, Tokyo (JP)

( * ) Notice: Subject to any disclaimer, the term of this patent is extended or adjusted under 35 U.S.C. 154(b) by 145 days.

(21) Appl. No.: 12/723,237

(22) Filed: Mar. 12, 2010

(65) Prior Publication Data

US 2010/0255244 A1 Oct. 7, 2010

(30) Foreign Application Priority Data

Apr. 2, 2009 (JP) .................................. 2009-090163

(51) Int. Cl.
*B32B 3/02* (2006.01)
(52) U.S. Cl. .................. 428/64.1; 428/64.4; 430/270.12
(58) Field of Classification Search .................. 428/64.4; 430/270.13
See application file for complete search history.

(56) References Cited

U.S. PATENT DOCUMENTS

| 6,007,889 A | 12/1999 | Nee |
| 6,280,811 B1 | 8/2001 | Nee |
| 6,451,402 B1 | 9/2002 | Nee |
| 6,689,444 B2 | 2/2004 | Nakai et al. |
| 6,764,735 B2 | 7/2004 | Nee |
| 6,790,503 B2 | 9/2004 | Nee |
| 7,045,187 B2 | 5/2006 | Nee |
| 2004/0191462 A1 | 9/2004 | Hosoda et al. |
| 2006/0181198 A1 | 8/2006 | Gotoh et al. |
| 2008/0182058 A1 | 7/2008 | Nee |
| 2009/0057140 A1 | 3/2009 | Takagi et al. |
| 2009/0057141 A1 | 3/2009 | Tauchi et al. |
| 2009/0176113 A1 | 7/2009 | Gotoh et al. |

FOREIGN PATENT DOCUMENTS

| JP | A-2002-15464 | 1/2002 |
| JP | A-2002-518596 | 6/2002 |
| JP | A-2004-284241 | 10/2004 |
| JP | A-2006-261636 | 9/2006 |
| JP | A-2007-092153 | 4/2007 |
| JP | A-2009-52122 | 3/2009 |
| JP | A-2009-57580 | 3/2009 |

*Primary Examiner* — Elizabeth Mulvaney
(74) *Attorney, Agent, or Firm* — Oliff & Berridge, PLC

(57) ABSTRACT

The present invention aims at providing a sputtering target for making an optical medium whose reflective layer is mainly composed of Ag and capable of attaining an optical medium which is excellent in surface smoothness and can sufficiently suppress noise and jitter, a method of making the same, an optical medium, and a method of making the same. The present invention provides a sputtering target for making an optical medium comprising 0.1 to 2 at % of one or two elements selected from the group consisting of Ta and Nb, 0.1 to 1 at % of Al, and the balance constituted by Ag and unavoidable impurities; and an optical medium comprising a reflective layer having this composition on a substrate.

5 Claims, 2 Drawing Sheets

US 8,105,674 B2

SPUTTERING TARGET FOR MAKING OPTICAL MEDIUM, METHOD OF MAKING SAME, OPTICAL MEDIUM, AND METHOD OF MAKING SAME

BACKGROUND OF THE INVENTION

1. Field of the Invention

The present invention relates to a sputtering target for making an optical medium such as an optical disc, a method of making the same, an optical medium, and a method of making the same.

2. Related Background Art

Optical media such as optical discs (e.g., BD (Blu-ray Disc)-R, BD-RE, and BD-ROM) and optical cards which are made by forming a reflective layer on a substrate by sputtering with a sputtering target and further forming an optical recording layer, a transparent cover layer for transmitting light therethrough at the time of reading or writing, or the like on the reflective layer have been known. Unless the reflective layer has a high surface smoothness on its film-deposition end surface side, such optical media fail to attain favorable reflection upon irradiation with laser beams, adversely affect structures of the optical recording layer, transparent cover layer, and the like formed on the reflective layer, and deteriorate characteristics such as jitter characteristics, for example.

As sputtering targets which can make reflective layers for optical media, Japanese Patent Application Laid-Open No. 2002-015464 and Japanese Translated International Patent Application Laid-Open No. 2002-518596 disclose alloys mainly composed of Ag.

SUMMARY OF THE INVENTION

However, the reflective layer formed by using the sputtering target made by an alloy composed mainly of Ag and accessorily of noble metals described in Patent Literature 2 may exhibit insufficient surface smoothness on its film-deposition end surface side, whereby the resulting optical medium may fail to suppress jitter sufficiently. For making a sputtering target which can yield a film having a favorable surface smoothness by using an alloy mainly composed of Ag and doped with rare-earth metals as described in Patent Literature 1, on the other hand, a special manufacturing process for preventing its constituent rare-earth metal particle surfaces from being oxidized must be employed, and the target cost is hard to reduce since the rare-earth metals are added.

In view of the problems mentioned above, it is an object of the present invention to provide an inexpensive sputtering target for making an optical medium which can attain an optical medium excellent in its surface smoothness and capable of sufficiently suppressing jitter, a method of making the same, an optical medium, and a method of making the same.

As a result of diligent studies, the inventors have found that a reflective layer formed by using a sputtering target containing 0.1 to 2 at % of one or two elements selected from the group consisting of Ta and Nb, 0.1 to 1 at % of Al, and the balance constituted by Ag and unavoidable impurities is excellent in its surface smoothness and can sufficiently suppress jitter of optical media. Since no rare-earth metals are necessary, the sputtering target can be made easily at a low cost.

A sputtering target for making an optical medium has a composition comprising 0.1 to 2 at % of one or two elements selected from the group consisting of Ta and Nb, 0.1 to 1 at % of Al, and the balance constituted by Ag and unavoidable impurities.

A optical medium in accordance with the present invention comprises a substrate and a reflective layer, disposed on the substrate, having a composition containing 0.1 to 2 at % of one or two elements selected from the group consisting of Ta and Nb, 0.1 to 1 at % of Al, and the balance constituted by Ag and unavoidable impurities.

A method of making an optical medium in accordance with the present invention comprises a step of forming a reflective layer by using a sputtering target containing 0.1 to 2 at % of one or two elements selected from the group consisting of Ta and Nb, 0.1 to 1 at % of Al, and the balance constituted by Ag and unavoidable impurities.

A method of making a sputtering target for making an optical medium in accordance with the present invention comprises a step of firing a material powder having a composition, mainly composed of Ag, containing 0.1 to 2 at % of one or two elements selected from the group consisting of Ta and Nb, 0.1 to 1 at % of Al, and the balance constituted by Ag and unavoidable impurities.

The present invention provides an inexpensive optical medium whose reflective layer is mainly composed of Ag and has excellent surface smoothness, and can sufficiently suppress jitter.

DESCRIPTION OF THE PREFERRED EMBODIMENTS

Figure 1:
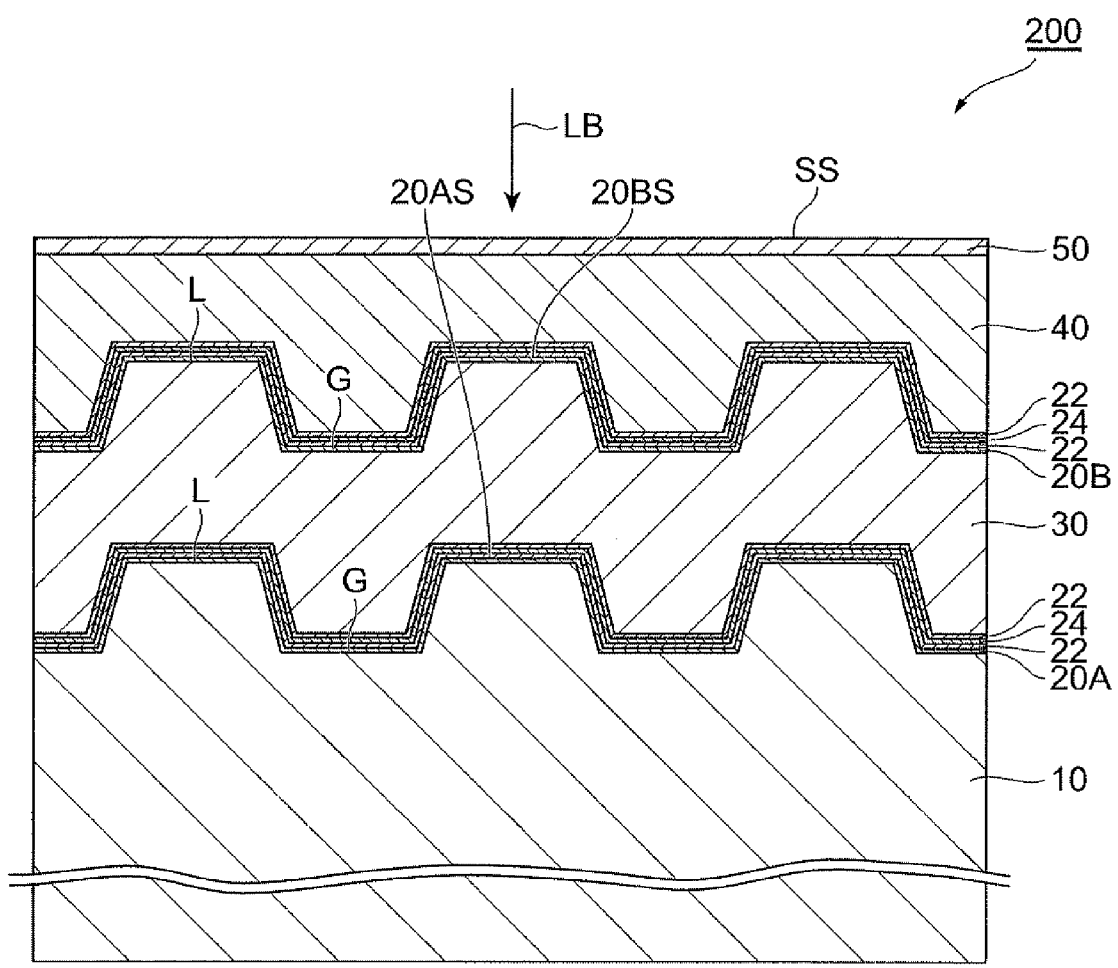
FIG. 1 is a sectional view of an optical disc 200 in accordance with an embodiment.

In the following, preferred embodiments of the present invention will be explained in detail with reference to the accompanying drawings. In the explanation of the drawings, the same or equivalent constituents will be referred to with the same signs while omitting their overlapping descriptions.

Sputtering Target for Making Optical Medium

The sputtering target for making an optical medium in accordance with an embodiment has a composition containing 0.1 to 2 at % of one or two elements selected from the group consisting of Ta and Nb, 0.1 to 1 at % of Al, and the balance constituted by Ag and unavoidable impurities.

From the viewpoint of optimizing the thickness of the reflective layer (in terms of the productivity, reliability, and the like) in particular, the composition preferably contains 0.1 to 1 at %, more preferably 0.2 to 0.7 at %, further preferably 0.2 to 0.5 at %, of one or two elements selected from the group consisting of Ta and Nb.

From the viewpoint of smoothness of the reflective layer surface, the composition preferably contains 0.2 to 0.7 at %, more preferably 0.3 to 0.5 at %, of Al.

The composition contains unavoidable impurities in addition to Ta, Nb, Al, and Ag. Examples of the unavoidable impurities include Si, Fe, Cu, and O (oxygen), each of which can be permitted up to about 100 atppm.

Though the reflective layer is less likely to vary its smoothness greatly in particular among the cases where Ta is contained without Nb, Nb is contained without Ta, and both Nb and Ta are contained, Nb is less expensive than Ta, which makes it preferable to contain Nb more than Ta, more preferable to contain Nb without Ta. Since Ta has a thermal conductivity higher than that of Nb, on the other hand, the thermal conductivity of the composition can be regulated by the compounding ratio of Nb and Ta if necessary.

The target is not restricted in particular in terms of the form, size, and the like. For example, the target may be a disc having a diameter of about 127 to 300 mm.

Though the shape of metal structure in the target is not restricted in particular, the average particle size of crystal particles constituting the target is preferably 100 μm or less.

Method of Making Sputtering Target for Making Optical Medium

An example of methods of making the above-mentioned sputtering target for making an optical medium will now be explained.

A material powder satisfying the above-mentioned element composition is prepared. For example, a mixture of different kinds of metal powders in which powders of Ag, Al, Ta, Nb, TaNb, and the like are mixed such as to satisfy the above-mentioned composition can be used as the material powder. For simplifying the manufacturing process, it is preferable to use material powders each made of a single constituent metal alone. Also, an alloy powder made by melting a mixture of metal powders mixed such as to attain the above-mentioned element composition and then pulverizing thus obtained alloy by atomization, e.g., an AgNbAl atomized alloy powder, may be used alone as the material powder.

Though the particle size of the material powder is not restricted in particular, each material powder preferably has a granularity of 320 meshes (45 μm) or less and a purity of 99.9 wt % or higher.

As the Ag powder, electrolytic silver powders and the like can be utilized.

As the powders of Al, Ta, Nb, AgNbAl, and the like, molten atomized powders atomized in an inert atmosphere and the like can be employed.

For mixing material powders, dry mixing is preferably used.

Next, the material powder is sintered at a high temperature under a high pressure in a vacuum or an inert gas atmosphere. An example of the sintering condition is constituted by a pressure of 100 to 500 kgf/cm$^2$ and a temperature of 400 to 800° C. Sintering an alloy powder alone makes the productivity more stable than sintering a mixture of different kinds of metal powders. The sintering can be achieved by hot isostatic pressing (HIP) as well.

Subsequently, thus obtained sintered body is subjected to mechanical processing such as cutting into a predetermined size, whereby a sputtering target is completed.

The sputtering target of the present invention can also be made without sintering. For example, the sputtering target may be made by melting the above-mentioned material powder in a vacuum or an inert gas atmosphere, cooling the molten material, and then forging and rolling it if necessary. In this case, however, the crystal particles constituting the target are likely to attain an average particle size of 1000 μm or greater, which may lower the sputtering rate or generate particles at the time of sputtering.

The sputtering target of the present invention may be subjected to wet etching of its surface or the like after the mechanical processing if necessary, whereby its pre-sputtering time can be shortened. The sputtering target of the present invention can also be made without the hot isostatic pressing (HIP) and the wet etching after the mechanical processing.

Optical Disc 200

A method of manufacturing an optical disc 200 as an example of the optical medium made by using the sputtering target for making an optical medium will now be explained.

The optical disc 200 illustrated in FIG. 1 is a writable optical disc known as a so-called BD-R or BD-RE, which is shaped as a disc having an outer diameter of about 120 mm and a thickness of about 1.2 mm and comprises a support substrate (substrate) 10, a first reflective layer 20A, a protective layer 22, a recording layer 24, an intermediate layer 30, a second reflective layer 20B, a protective layer 22, a recording layer 24, a protective layer 22, a transparent cover layer 40, and a topcoat layer 50 in this order.

The optical disc 200 in accordance with this embodiment is one capable of reading or recording data when a laser beam LB having a wavelength λ of 380 nm to 450 nm, preferably of about 405 nm, is made incident on the topcoat layer 50 side that is opposite to the support substrate 10.

Specifically, at the time of recording, the laser beam LB is focused on the recording layer 24, so that its heat causes an abrasion, phase change, decomposition, or the like in the recording layer 24, whereby a recording mark is fainted. The reflectance to the laser beam LB varies greatly between the recording mark part and the other part (blank area) in the recording layer, and thus can be used for reading data.

The support substrate 10 is a disc-shaped substrate used for securing a thickness (about 1.2 mm) required for the optical disc 200, while its one side is formed with a groove G and a land L, spirally extending from near its center part to an outer edge part, for guiding the laser beam LB and providing a base for bumps and depressions for recording. Various materials can be used for making the support substrate 10. For example, glass, ceramics, and resins can be used. Among them, resins are preferred from the viewpoint of easiness in shaping. Examples of such resins include polycarbonate, olefin, acrylic, epoxy, polystyrene, polyethylene, polypropylene, silicone, fluorine, ABS, and urethane resins. Among them, polycarbonate and olefin resins are preferred in particular from the viewpoint of workability and the like.

The first reflective layer 20A acts to reflect the laser beam LB entering from a light incident surface SS which is the front face of the topcoat layer 50 and allow the reflected light to exit from the light incident surface SS, while rapidly dissipating the heat caused by the laser beam LB. This enhances the optical reflectance to the laser beam LB and thus can improve reading characteristics. The reflective layer 20A has a composition corresponding to that of the above-mentioned sputtering target.

The thickness of the reflective layer 20A is preferably set to 5 to 300 nm, 20 to 200 nm in particular. When the thickness of the reflective layer 20A is less than 5 nm, its film-deposition end surface 20AS may be hard to attain sufficient surface smoothness. When the thickness of the reflective layer 20A exceeds 300 nm, on the other hand, not only the surface smoothness of the film-deposition end surface 20AS becomes lower, but also the film forming time becomes longer, thereby lowering the productivity. When the thickness of the reflective layer 20A is set to 5 to 300 nm, 20 to 200 nm in particular, the surface smoothness can be obtained sufficiently, while the productivity can be kept from decreasing.

The protective layers 22 act to physically and/or chemically protect the recording layer 24 disposed therebetween. Since the recording layer 24 is held between the protective layers 22, recorded information is effectively prevented from deteriorating over a long period after optical recording. As a constituent material of the protective layers 22, a transparent dielectric can be used, for example. The protective layers 22 also act to enhance the difference in optical characteristics between before and after the recording. For easily achieving this, it is preferred to choose a material having a high refractive index (n) in the wavelength region of the laser beam LB employed, i.e., 380 to 450 nm, at about 405 nm in particular. The recording sensitivity becomes lower as the energy absorbed by the protective layers 22 is greater upon irradiation with the laser beam LB. For preventing this, it is preferred to choose a material having a low extinction coefficient (k) in the wavelength region of 380 to 450 nm, at about 405 nm in particular. Though the protective layers 22 are arranged on both sides of the recording layer 24, one or both of them may be omitted.

Examples of materials usable for the protective layer 22 include oxides, nitrides, sulfides, carbides, fluorides, and their mixtures.

Examples of the oxides include those of tantalum (Ta), aluminum (Al), silicon (Si), titanium (Ti), germanium (Ge), niobium (Nb), tin (Sn), cerium (Ce), yttrium (Y), and lanthanum (La), i.e., $Ta_2O_5$, $Al_2O_3$, $SiO_2$, $TiO_2$, $GeO_2$, $Nb_2O_5$, $SnO_2$, $CeO_2$, $Y_2O_3$, and $La_2O_3$. Examples of the nitrides include those of aluminum (Al), silicon (Si), and germanium (Ge), i.e., AlN, $Si_3N_4$, and GeN. An example of the sulfides is a sulfide of zinc (Zn), i.e., ZnS. An example of the carbides is a carbide of silicon (Si), i.e., SiC. An example of the fluorides is a fluoride of magnesium (Mg), i.e., $MgF_2$. Examples of their mixtures include SiAlON (a mixture of $SiO_2$, $Al_2O_3$, $Si_3N_4$, and AlN) and LaSiON (a mixture of $La_2O_3$, $SiO_2$, and $Si_3N_4$).

A pair of protective layers 22, 22 holding the recording layer 24 therebetween may be constructed by either the same material or different materials. At least one of the pair of protective layers 22, 22 may have a multilayer structure constituted by a plurality of dielectric layers.

Though not restricted in particular, the thickness of each protective layer 22 is preferably 3 to 200 nm in view of the fact that the laser beam LB employed has a wavelength in the blue wavelength region of 380 to 450 nm.

The recording layer 24 is a layer in which recording marks can be formed. Various materials such as inorganic and organic ones can be employed for the recording layer 24. Examples of inorganic materials include single-layer films of various metals, semimetals, and alloys and multilayer films in which semimetal or alloy layers are laminated (e.g., a multilayer structure constituted by Si and copper alloy layers), while examples of organic materials include organic dye layers such as those of azo dye.

Though not restricted in particular, the thickness of the recording layer 24 is preferably set to 2 to 40 nm, more preferably 2 to 20 nm, further preferably 2 to 15 nm.

The intermediate layer 30 is a layer transparent to the laser beam LB. Though not restricted in particular, examples of materials for the intermediate layer 30 include resin materials, such as UV-curable resins in particular. The thickness of the intermediate layer 30 is preferably about 20 to 30 μm on average. The front face of the intermediate layer 30 is also formed with a groove G and a land L as in the support substrate 10.

As with the reflective layer 20A, the reflective layer 20B has a composition corresponding to that of the above-mentioned sputtering target. The reflective layer 20B is required to transmit a part of the laser beam LB and thus is preferably thinner than the reflective layer 20A.

The protective layer 22, recording layer 24, and protective layer 22 disposed between the reflective layer 20B and transparent cover layer 40 are the same as those mentioned above.

The transparent cover layer 40 is a layer transparent to the laser beam LB. Examples of materials for the transparent cover layer 40 include resin materials such as UV-cured acrylic resins. Its thickness is about 50 to 100 μm, for example.

The topcoat layer 50 is used for protecting the front surface of the optical disc 200. Examples of materials usable for the topcoat layer 50 include resin materials such as UV-cured acrylic resins.

The optical disc 200 in accordance with this embodiment is a next-generation optical disc in which films are sequentially formed from the side opposite to the light incident surface SS, whereby the surfaces 20AS, 20BS of the reflective layers 20A, 20B on the light incident surface SS side tend to become rougher than in optical discs of a type in which films are sequentially formed from the light incident surface side as in CD and DVD. The reflective layers in optical discs of a type in which films are sequentially formed from the side opposite to the light incident surface as in CD and DVD have their initially formed surfaces located on the light incident surface side and thus exhibit surface characteristics substantially coinciding with those of their bases. In the next-generation optical discs in which films are sequentially formed from the side opposite to the light incident surface SS as in the optical disc 200 in accordance with this embodiment, by contrast, the reflective layers 20A, 20B have their film-deposition end surfaces 20AS, 20BS located on the light incident surface SS side and thus lower their surface characteristics because of crystal growth and the like during the film forming process. It is therefore necessary for the reflective layers 20A, 20B to be made from a material which is excellent in surface smoothness in their final surfaces 20AS, 20BS and can fully suppress jitter. The reflective layers 20A, 20B formed by sputtering with the sputtering target having the above-mentioned composition satisfy these requirements. The reflective layers 20A, 20B exhibit a sufficiently high reflectance to laser beams having a wavelength λ within the range of 380 to 450 nm and an appropriate thermal conductivity, thereby achieving a sufficient optical reflectance to the laser beam LB while allowing the heat caused by the laser beam LB to dissipate rapidly.

Optical Disc 100

Figure 2:
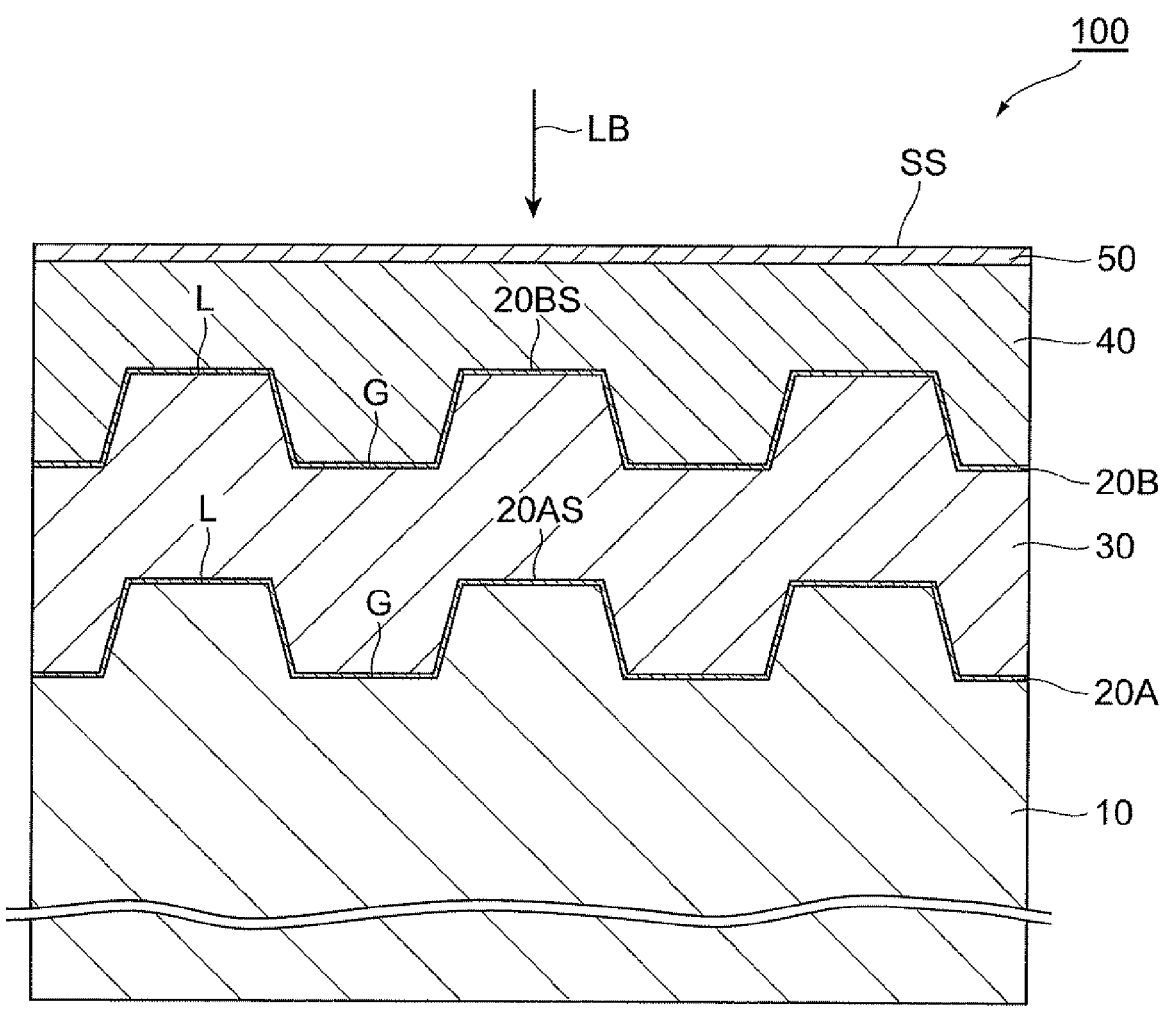
FIG. 2 is a sectional view of an optical disc 100 in accordance with an embodiment.

A second optical disc 100 will now be explained. The optical disc 100 illustrated in FIG. 2 is a so-called BD-ROM, which is an unwritable, read-only optical disc. Only its differences from the optical disc 200 will be explained here.

The second optical disc 100 lacks the protective layer 22, recording layer 24, and protective layer 22 between the reflective layer 20A and intermediate layer 30, and the protective layer 22, recording layer 24, and protective layer 22 between the reflective layer 20B and transparent cover layer 40. Thus constructed optical disc 100 achieves advantageous effects similar to those mentioned above.

Though each of the above-mentioned optical discs 100, 200 is of a so-called double layer recording type having two reflective layers 20A, 20B, the present invention is also applicable to those of a single-layer recording type with only one reflective layer and multilayer recording types with three or more reflective layers.

These optical discs can be obtained by known methods except for forming the reflective layers 20A, 20B by using the above-mentioned sputtering target. Their sputtering method is not restricted in particular. Favorable sputtering conditions include those of DC sputtering.

The present invention can be modified in various ways without being limited to the above-mentioned embodiments. For example, the optical medium is not limited to the BD exemplified in the above-mentioned embodiments and may be an optical disc other than the BD. Though the above-mentioned embodiments illustrate optical discs, the optical medium is not limited in particular in terms of the top view form and may be an optical card having a rectangular form, for example.

EXAMPLES

Examples 1 to 6 and Comparative Examples 1 to 7

Respective powders of Al, Ag, Ta, Nb, and Cr each having a size of 320 meshes (particle size of 45 μM or less) and a purity of 99.9 mass % and an Nd powder having an average particle size of 500 and a purity of 99.9 mass % were weighed so as to yield atomic compositions listed in Table 1, and then dry-mixed so as to obtain mixed powders in accordance with examples and comparative examples. Each mixed powder was sintered in a vacuum. The sintering condition was constituted by a pressure of 200 kgf/cm² and such a temperature profile that the powder was rapidly heated to 720° C. in 30 min, held at 720° C. for 30 min, cooled to 660° C., held at 660° C. for 30 min, and then slowly cooled to room temperature.

The resulting sintered bodies were lathed into respective sputtering targets each having a diameter of 200 mm and a thickness of 8 mm.

Using each of the sputtering targets, on a support substrate made of polycarbonate having a thickness of 1.1 mm and a diameter of 120 mm formed with a land and a groove, a reflective layer 20A was formed by a thickness of 80 nm by DC magnetron sputtering. Thereafter, 6 nm of CeO₂—Al₂O₃ (80:20 mol %) and 8 nm of ZnS—SiO₂ (50:50 mol %) were formed as a first protective layer 22 (on the support substrate 10 side) by RF magnetron sputtering, 12 nm of SbTeGe (75:19:6 at %) were formed as a recording layer 24 by DC magnetron sputtering, 20 nm of ZnS—SiO₂ (50:50 mol %) by RF magnetron sputtering and 30 nm of AN by DC magnetron reactive sputtering were formed as a second protective layer 22 (on the intermediate layer 30 side), and then a transparent cover layer was formed by an acrylic UV-curable resin, whereby a single-layer type BD-RE disc was obtained.

The examples and comparative examples were subjected to the following evaluations, Surface Roughness Surface roughness Ra in an area of 2 μm² on the reflective layer 20A in the mirror surface part of the disc before forming the protective layers 22 and recording layer 24 was measured by AFM. Cases where Ra<0.5 nm, 0.5 nm≦Ra≦0.8 nm, and Ra>0.8 nm were evaluated as good, fair, and poor, respectively.

Jitter

Using an optical disc evaluation system (product name: DDU-1000, manufactured by Pulstec Industrial Co., Ltd., having an objective lens numerical aperture of 0.85 and a laser wavelength of 405 nm), each BD-RE disc was irradiated with a multipulse emission pattern at a recording power of 6.2 mW and an erasing power of 3.7 mW while being rotated at a linear velocity of 9.84 m/sec (equivalent to 2×), so as to record a signal thereon. For thus recorded signal, jitter was measured by a time interval analyzer (product name: TA-520 manufactured by Yokogawa Electric Corporation). Jitter was evaluated as good, fair, and poor when less than 6.8%, at least 6.8% but less than 7.0%, and 7.0% or greater, respectively.

Shelf Test

After each disc was left for 100 hr in an environment of 80° C., 80% RH, jitter was measured again. Cases where the amount of change (increase) was less than 0.5%, at least 0.5% but less than 1.0%, and 1.0% or greater were evaluated as good, fair, and poor, respectively.

Table 1 lists the results.

TABLE 1

| | Ta [at %] | Nb [at %] | Al [at %] | Cr [at %] | Cu [at %] | Nd [at %] | Ag [at %] | Surface roughness Ra | Jitter | Shelf test |
|---|---|---|---|---|---|---|---|---|---|---|
| Example 1 | — | 0.7 | 0.9 | — | — | — | balance | good | good | good |
| Example 2 | 0.7 | — | 0.9 | — | — | — | balance | good | good | good |
| Example 3 | — | 1.7 | 0.9 | — | — | — | balance | good | good | good |
| Example 4 | — | 0.4 | 0.4 | — | — | — | balance | good | good | good |
| Example 5 | — | 0.2 | 0.2 | — | — | — | balance | good | good | good |
| Example 6 | 0.7 | 0.5 | 0.5 | — | — | — | balance | good | good | good |
| Comparative Example 1 | — | — | — | 2.0 | — | — | balance | poor | poor | — |
| Comparative Example 2 | — | — | — | — | 0.5 | 0.5 | balance | fair | fair | — |
| Comparative Example 3 | — | 1.5 | — | — | — | — | balance | fair | fair | — |
| Comparative Example 4 | — | — | 0.9 | — | — | — | balance | poor | poor | — |
| Comparative Example 5 | 1 | 1.5 | 0.9 | — | — | — | balance | poor | poor | — |
| Comparative Example 6 | — | 0.7 | 1.5 | — | — | — | balance | fair | fair | — |
| Comparative Example 7 | 0.7 | 0.5 | — | — | — | — | balance | poor | poor | — |

The reflective layers made by the targets in accordance with the present invention were seen to exhibit sufficient surface smoothness and fully suppress jitter.

What is claimed is:

1. A sputtering target for making an optical medium, the sputtering target comprising 0.1 to 2 at % of one or two elements selected from the group consisting of Ta and Nb, 0.1 to 1 at % of Al, and the balance constituted by Ag and unavoidable impurities.

2. An optical medium comprising:
   a substrate; and
   a reflective layer, disposed on the substrate, having a composition containing 0.1 to 2 at % of one or two elements selected from the group consisting of Ta and Nb, 0.1 to 1 at % of Al, and the balance constituted by Ag and unavoidable impurities.

3. The optical medium according to claim 2, wherein a laser beam for reading or writing irradiates the reflective layer from a film-deposition end surface side thereof.

4. A method for making an optical medium, the method comprising a step of forming a reflective layer obtained by using a sputtering target containing 0.1 to 2 at % of one or two elements selected from the group consisting of Ta and Nb, 0.1 to 1 at % of Al, and the balance constituted by Ag and unavoidable impurities.

5. A method of making a sputtering target for making an optical medium, the method comprising a step of firing a material powder having a composition containing 0.1 to 2 at % of one or two elements selected from the group consisting of Ta and Nb, 0.1 to 1 at % of Al, and the balance constituted by Ag and unavoidable impurities.

* * * * *